United States Patent [19]

Zemek

[11] Patent Number: 4,600,359
[45] Date of Patent: Jul. 15, 1986

[54] INDEXING METHOD AND APPARATUS

[75] Inventor: Thomas G. Zemek, Mansfield Depot, Conn.

[73] Assignee: United Technologies Corporation, Hartford, Conn.

[21] Appl. No.: 686,312

[22] Filed: Dec. 24, 1984

[51] Int. Cl.⁴ .............................................. B25J 19/02
[52] U.S. Cl. ..................................... 414/754; 269/63; 279/5; 406/87
[58] Field of Search .................. 414/755, 754; 406/87; 269/63; 279/3, 5; 29/156 HR, 801

[56] References Cited

U.S. PATENT DOCUMENTS

| | | | |
|---|---|---|---|
| 3,227,437 | 1/1966 | Osborn, Jr. ................... | 269/63 |
| 3,729,206 | 4/1973 | Cachon et al. ................... | 279/3 |
| 3,890,508 | 6/1975 | Sharp ................... | 406/87 X |
| 4,242,038 | 12/1980 | Santini et al. ................... | 414/755 |

Primary Examiner—Robert J. Spar
Assistant Examiner—Janice Krizek
Attorney, Agent, or Firm—John Swiatocha

[57] ABSTRACT

Pneumatic indexing of a shaped component (127) is attained by adjusting the position of the component until fluid passages (130) therein are aligned with supply and vent passages (100) and (110) in a pneumatic head (15). Such alignment causes the relief of supply passage pressure through the vent passages and a resulting retention of the shaped component in an indexed position thereof.

10 Claims, 2 Drawing Figures

INDEXING METHOD AND APPARATUS

DESCRIPTION

1. Technical Field

This invention relates to a method and apparatus for the automated indexing of a component part of an apparatus.

2. Background Art

The indexing of the component parts of an apparatus prior to the automated assembly thereof is a concept long familiar to those skilled in the art of automated mass production. In the assembly of fluid handling apparatus, indexing of the component parts of such apparatus on the basis of the presence of apertures, passages or othr fluid handling surface features has been found convenient. While the prior art is replete with various techniques for identification of surface features such as various optical and electromagnetic techniques, the implementation of such techniques often tends to be costly and complicated and of limited durability and reliability. While pneumatic systems for providing dimensional data such as the distance from a surface to an orifice by the measurement of pressure variations are known to exist, a practical pneumatic system for indexing fluid handling components on the basis of the presence of passages or voids therein has yet to be practically, economically and effectively implemented.

3. Disclosure of Invention

It is among the objects of the present invention to provide a practical, economical and reliable method and apparatus for indexing component parts on the basis of the presence of fluid handling passages therein.

In accordance with the present invention, a shaped component part is disposed in a fluid flow path between pneumatic supply and vent ducts and adjusted in position as the pressure in one of the ducts is monitored, the pressure in such duct, when reaching a predetermined level, being indicative of the component part having reached an indexed position thereof. In the preferred embodiment, the component part includes one or more passages which, when aligned with the supply and vent ducts allows relatively free fluid communication therebetween such that the monitored pressure in the supply duct is minimized when the component part reaches the indexed position. The supply and vent ducts may be commonly disposed within a pneumatic head through which an output member of a pneumatic actuator is extendable into engagement with one of the component passages to hold the component in its indexed position in response to the pressure drop in the supply duct. The pneumatic actuator may be controlled by pneumatic relays responsive to the drop in supply pressure.

BEST MODE FOR CARRYING OUT THE INVENTION AND INDUSTRIAL APPLICABILITY THEREOF

Figure 1:
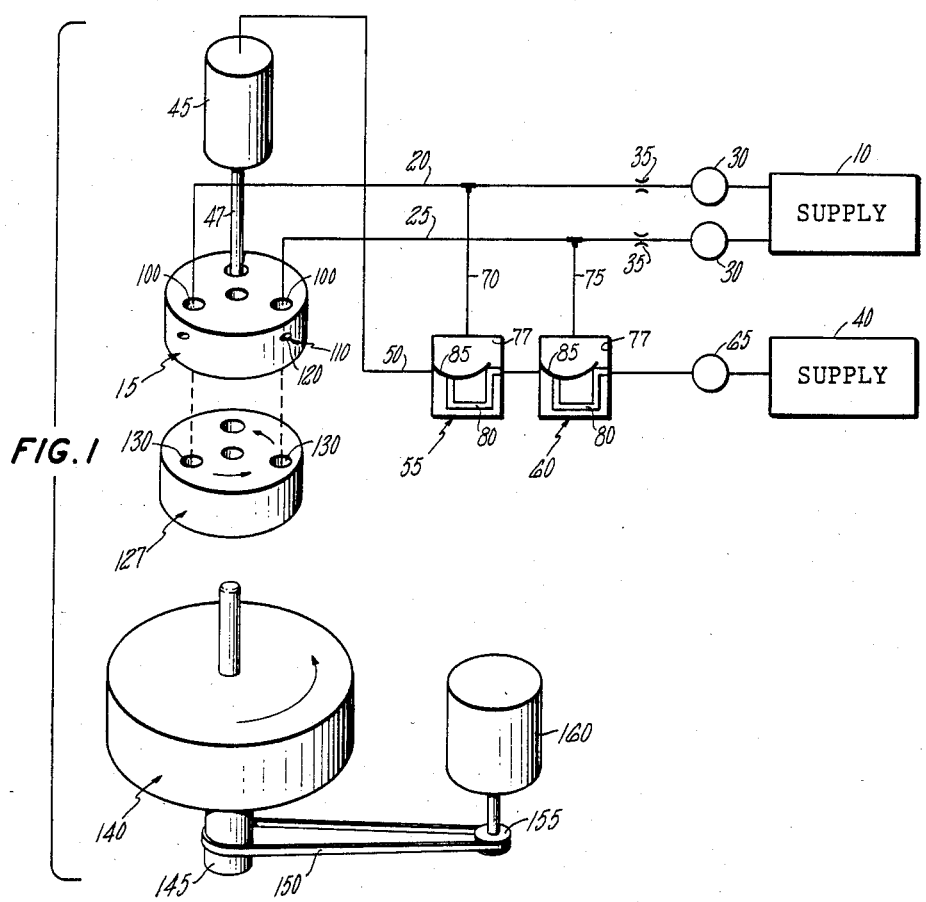
FIG. 1 is a schematic diagram of the apparatus of the present invention.

Referring to FIG. 1, a primary pneumatic supply 10 supplies compressed air to pneumatic head 15 through supply ducts 20 and 25. Each supply duct includes a regulator 30 and a restriction 35 serially disposed therein whereby a constat weight flow of air is supplied through the supply ducts to the head. A secondary pneumatic supply 40 provides compressed air to a pneumatic actuator 45 having output member 47 downwardly extendable therefrom through line 50 having pneumatic relays 55 and 60 as well as regulator 65 serially disposed therein. Relay 55 communicates with supply duct 20 through line 70 while relay 60 communicates with supply duct 25 through line 75. For purposes of illustration, each relay includes a chamber 77 opening at the left-hand side to line 50 and to a corresponding supply duct through either of lines 70 or 75. Each relay also includes an internal passage 80 selectively sealed by a diaphragm 85 in response to the pressure thereon. In the event that the secondary supply pressure in passages 80 is greater than the primary supply pressure in lines 70 and 75, the secondary supply pressure in passages 80 moves diaphragm 85 upwardly, thereby opening line 50 to the secondary supply pressure which is thereby applied to actuator 45 to effect downward movement of output member 47 thereof.

Figure 2:
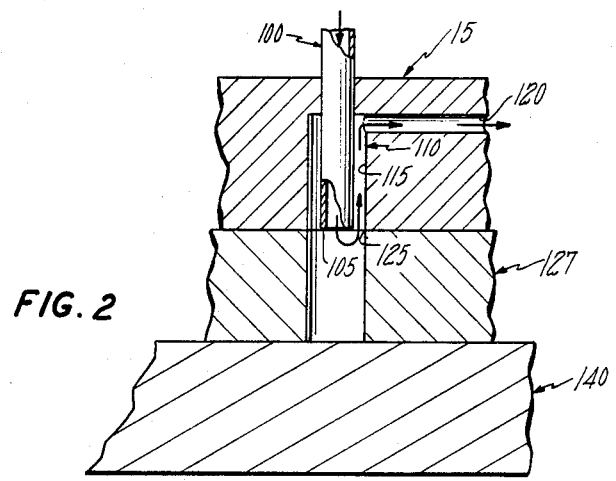
FIG. 2 is an enlarged, sectioned, fragmentary elevation of a pneumatic head employed in the preferred embodiment of the present invention.

Pneumatic head 15 may be provided with means (not shown) for moving the head from beneath actuator 45 when output member 47 is retracted (raised). As schematically illustrated, the pneumatic head comprises at least one vertical supply passage 100 terminating at orifice 105 (see FIG. 2). Pneumatic head 15 also includes a vent passage 110 including an axial portion 115 outwardly concentric with supply passage 100 and a radial portion 120 communicating with axial portion 115 at the upper end thereof. Axial portion 115 terminates at the lower end thereof at orifice 125.

A shaped component 127 to be indexed includes one or more passages or voids 130 which align with supply passage 100 and axial portions 115 of vent passage 110 when the component is indexed.

The position of component 127 is adjusted by the rotation thereof on turntable 140 including a center spindle which extends through central apertures in pneumatic head 15 and component 127 and a central shaft 145 around which belt 150 is looped. The opposite end of belt 150 is looped around pulley 155 driven by electric motor 160.

In operation, to index component 127, the component is placed on the turntable and rotated therewith while pneumatic head 15 is brought into registry with the component immediately thereover. Primary supply air at a constant weight flow is supplied to passages 100 in the pneumatic head through supply ducts 20 and 25 from primary supply 10. When the component reaches an indexed position, passages 130 align with coplanar orifices 105 and 125 establishing generally unrestricted fluid communication between these orifices and hence between supply passage 100 and vent passage 110. This relieves the supply pressure in lines 20 and 25 and, due to the connection of these lines with relay chambers 77, relieves the pressure above diaphragms 85. Such pressure relief causes the secondary pressure within internal passages 80 to move diaphragms 85 upwardly thereby opening passages 80 to line 50 for the application of secondary pressure to actuator 45. This drives output member 47 downwardly (as illustrated) through the pneumatic head and through one of the passages 130 in the now indexed component, thereby preventing continued rotation of turntable 140 from moving the component from its indexed position.

It is thus seen that the indexing technique of the present invention is characterized by an economy of structure, involving only a minimal number of component parts as well as enhanced accuracy and reliability since it is not influenced by ambient electrical or optical noise. While a specific embodiment of this system has been shown, it will be appreciated that the disclosure herein will suggest various equivalent techniques to those skilled in the art. For example, while the system has been described as operating pneumatically, it will be appreciated that fluids other than air may be employed and, therefore, as used herein "pneumatic" and "air" shall refer not only to air but other operating fluids as well. While indexing based on the orientation of a pair of passages has been described, and hence a pair of pneumatic relays shown, it will be appreciated that indexing on the basis of a greater or lesser number of passages may also be employed without departing from the present invention by utilization of a corresponding number of relays. Furthermore, while the relays have been described as being responsive to the primary supply pressure, it will be appreciated that vent pressure may also be used to control the operation of the relays. Accordingly, it is intended by the following claims to cover these and any other modifications which fall within the true spirit and scope of this invention.

Having thus described the invention, what is claimed is:

1. A method of pneumatically indexing a shaped component, said method being characterized by the steps of:
   providing a pneumatic supply duct and a pneumatic vent duct, said supply and vent ducts being blocked from one another by said component in an unindexed position and placed in communication with one another by the shape of said component in an indexed position;
   pressurizing said supply duct with air;
   sensing the pressure in one of said supply or vent ducts;
   adjusting the position of said component; and
   terminating said adjustment when said pressure in said one duct reaches a predetermined level indicating communication between said supply and vent ducts and therefore, an indexed position of said component.

2. The method of claim 1 characterized by said supply and vent ducts comprising at least in part and terminating in, supply and vent passages respectively, disposed in a pneumatic head.

3. The method of claim 2 characterized by said supply and vent passages being disposed within one another in said head and include generally coplanar orifices which are disposed in communication with each other by mutual registry with a void in said component.

4. The method of claim 1 characterized by said step of terminating said adjustment of said component in its indexed position being effected by an actuator responsive to at least one pneumatic relay which selectively energizes said actuator in response to said pressure in said one duct reaching said predetermined level.

5. Apparatus for indexing a shaped component, said apparatus comprising:
   at least one pneumatic supply duct;
   at least one pneumatic vent duct;
   a head disposing said pneumatic supply and vent ducts proximally to one another and to said shaped component such that corresponding supply and vent ducts are blocked from one another by said component in an unindexed position thereof and placed in communication with one another by the shape of said component in an indexed position thereof;
   means sensing the pressure within at least one of said supply and vent ducts;
   means adjusting the position of said component; and
   means responsive to said pressure sensing means for terminating adjustment of said component part in its indexed position when the pressure in said one duct reaches a predetermined level indicating a predetermined extent of communication between said supply and vent ducts and therefore an indexed position of said component.

6. The apparatus of claim 5 characterized by:
   said supply and vent ducts comprising at least in part, said terminating in, supply and vent passages respectively, disposed in a pneumatic head.

7. The apparatus of claim 6 characterized by said supply and vent passages being disposed one within the other in said head and including generally coplanar orifices which are disposed in communication with each other by mutual registry with a void in said component.

8. The apparatus of claim 5 characterized by said means for adjusting the position of said component comprising a turntable.

9. The apparatus of claim 5 characterized by:
   said means for sensing the pressure within said one duct comprising a pneumatic relay; and
   said means for terminating adjustment of said component part in its indexed position comprising a pneumatic actuator having an output member engageable with said component for terminating adjustment thereof in it indexed position, said actuator being responsive to said pneumatic relay and therefore, said pressure within said one duct.

10. The apparatus of claim 9 characterized by:
    said shape of said component including a void therewithin through which said supply and vent ducts communicate when said component occupies said indexed position.

* * * * *